US009917066B2

(12) United States Patent
Aoi et al.

(10) Patent No.: US 9,917,066 B2
(45) Date of Patent: Mar. 13, 2018

(54) SEMICONDUCTOR DEVICE HAVING STACKED CHIPS, A RE-DISTRIBUTION LAYER, AND PENETRATION ELECTRODES

(71) Applicant: Panasonic Corporation, Osaka (JP)

(72) Inventors: Nobuo Aoi, Hyogo (JP); Masaru Sasago, Toyama (JP); Yoshihiro Mori, Osaka (JP); Takeshi Kawabata, Osaka (JP); Takashi Yui, Shiga (JP); Toshio Fujii, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 14/332,394

(22) Filed: Jul. 16, 2014

(65) Prior Publication Data
US 2014/0327157 A1 Nov. 6, 2014

Related U.S. Application Data

(63) Continuation of application No. PCT/JP2013/000071, filed on Jan. 11, 2013.

(30) Foreign Application Priority Data

Feb. 9, 2012 (JP) .................................. 2012-025777

(51) Int. Cl.
*H01L 23/00* (2006.01)
*H01L 23/31* (2006.01)
(Continued)

(52) U.S. Cl.
CPC ............ *H01L 24/01* (2013.01); *H01L 21/568* (2013.01); *H01L 21/82* (2013.01);
(Continued)

(58) Field of Classification Search
CPC .................... H01L 24/97; H01L 24/96; H01L 2224/023–2224/024; H01L 2224/14181;
(Continued)

(56) References Cited

U.S. PATENT DOCUMENTS 6,617,682 B1 * 9/2003 Ma .......................... H01L 23/36
174/253
2002/0041027 A1 * 4/2002 Sugizaki ....................... 257/737
(Continued)

FOREIGN PATENT DOCUMENTS

JP 2002-118198 4/2002
JP 2004-140037 5/2004
(Continued)

OTHER PUBLICATIONS

International Search Report of PCT Application No. PCT/JP2013/000071 dated Apr. 16, 2013.
(Continued)

*Primary Examiner* — Kevin Parendo
(74) *Attorney, Agent, or Firm* — Panasonic IP Management; Kerry S. Culpepper

(57) ABSTRACT

A lamination structure includes a first semiconductor chip and a second semiconductor chip stacked via a bonding section so that a rear surface of the first semiconductor chip faces the main surface of the second semiconductor chip. At least a part of a side surface of the first semiconductor chip are covered with a first resin, a distribution layer is formed on the plane formed of the main surface of the first semiconductor chip and a surface of the first resin. At least part of electrodes existing in the main surface of the second semiconductor chip is electrically connected to at least part of first external electrodes formed on the distribution layer via the penetration electrodes that penetrate the first semiconductor chip.

22 Claims, 22 Drawing Sheets

(51) Int. Cl.
*H01L 23/48* (2006.01)
*H01L 25/065* (2006.01)
*H01L 21/56* (2006.01)
*H01L 21/82* (2006.01)

(52) U.S. Cl.
CPC ...... *H01L 23/3114* (2013.01); *H01L 23/3185* (2013.01); *H01L 24/19* (2013.01); *H01L 24/80* (2013.01); *H01L 24/92* (2013.01); *H01L 24/94* (2013.01); *H01L 24/96* (2013.01); *H01L 24/97* (2013.01); *H01L 25/0657* (2013.01); *H01L 23/481* (2013.01); *H01L 2224/02379* (2013.01); *H01L 2224/02381* (2013.01); *H01L 2224/0401* (2013.01); *H01L 2224/04105* (2013.01); *H01L 2224/05548* (2013.01); *H01L 2224/12105* (2013.01); *H01L 2224/13005* (2013.01); *H01L 2224/13025* (2013.01); *H01L 2224/14131* (2013.01); *H01L 2224/14135* (2013.01); *H01L 2224/16145* (2013.01); *H01L 2224/16225* (2013.01); *H01L 2224/16238* (2013.01); *H01L 2224/32145* (2013.01); *H01L 2224/73204* (2013.01); *H01L 2224/73259* (2013.01); *H01L 2224/83104* (2013.01); *H01L 2224/9202* (2013.01); *H01L 2224/92224* (2013.01); *H01L 2224/93* (2013.01); *H01L 2224/94* (2013.01); *H01L 2224/96* (2013.01); *H01L 2224/97* (2013.01); *H01L 2225/06513* (2013.01); *H01L 2225/06541* (2013.01); *H01L 2225/06568* (2013.01); *H01L 2924/15311* (2013.01)

(58) Field of Classification Search
CPC ................. H01L 2224/17181; H01L 2224/32145–2224/32148; H01L 2224/33181; H01L 2224/16145–2224/16148; H01L 23/522–23/53295; H01L 23/3157; H01L 23/3185; H01L 23/3192; H01L 25/04–25/0756
See application file for complete search history.

(56) References Cited

U.S. PATENT DOCUMENTS

| | | |
|---|---|---|
| 2004/0070064 A1 | 4/2004 | Yamane et al. |
| 2006/0050454 A1 | 3/2006 | Koudate et al. |
| 2007/0126085 A1 | 6/2007 | Kawano et al. |
| 2008/0308917 A1* | 12/2008 | Pressel ............... H01L 24/19 257/676 |
| 2008/0308928 A1* | 12/2008 | Chang et al. ............. 257/723 |
| 2009/0283898 A1* | 11/2009 | Janzen ........... H01L 21/76898 257/698 |
| 2010/0144091 A1 | 6/2010 | Kawano et al. |
| 2011/0062592 A1* | 3/2011 | Lee et al. ................. 257/774 |
| 2011/0285007 A1* | 11/2011 | Chi .................. H01L 24/96 257/686 |
| 2012/0273959 A1* | 11/2012 | Park et al. ................ 257/774 |
| 2012/0280406 A1 | 11/2012 | Domae |
| 2013/0105991 A1* | 5/2013 | Gan et al. ................. 257/777 |
| 2014/0091473 A1* | 4/2014 | Len ................... H01L 24/05 257/774 |
| 2015/0187608 A1* | 7/2015 | Ganesan ........ H01L 23/49811 257/738 |

FOREIGN PATENT DOCUMENTS

| | | |
|---|---|---|
| JP | 2005-093943 | 4/2005 |
| JP | 2006-080145 | 3/2006 |
| JP | 2007-180529 | 7/2007 |
| JP | 2008-283127 | 11/2008 |
| WO | 2011/086611 | 7/2011 |

OTHER PUBLICATIONS

ITRS 2007 A&P Chapter p. 41.
Taking wafer level pakaging to the next stage. Edward Furgut. Semicon Europa 2006, Advanced Packaging Conference.
Technology platforms for 3D integration: present and future, Carlo Cognetti, EMC 3D workshop.

* cited by examiner

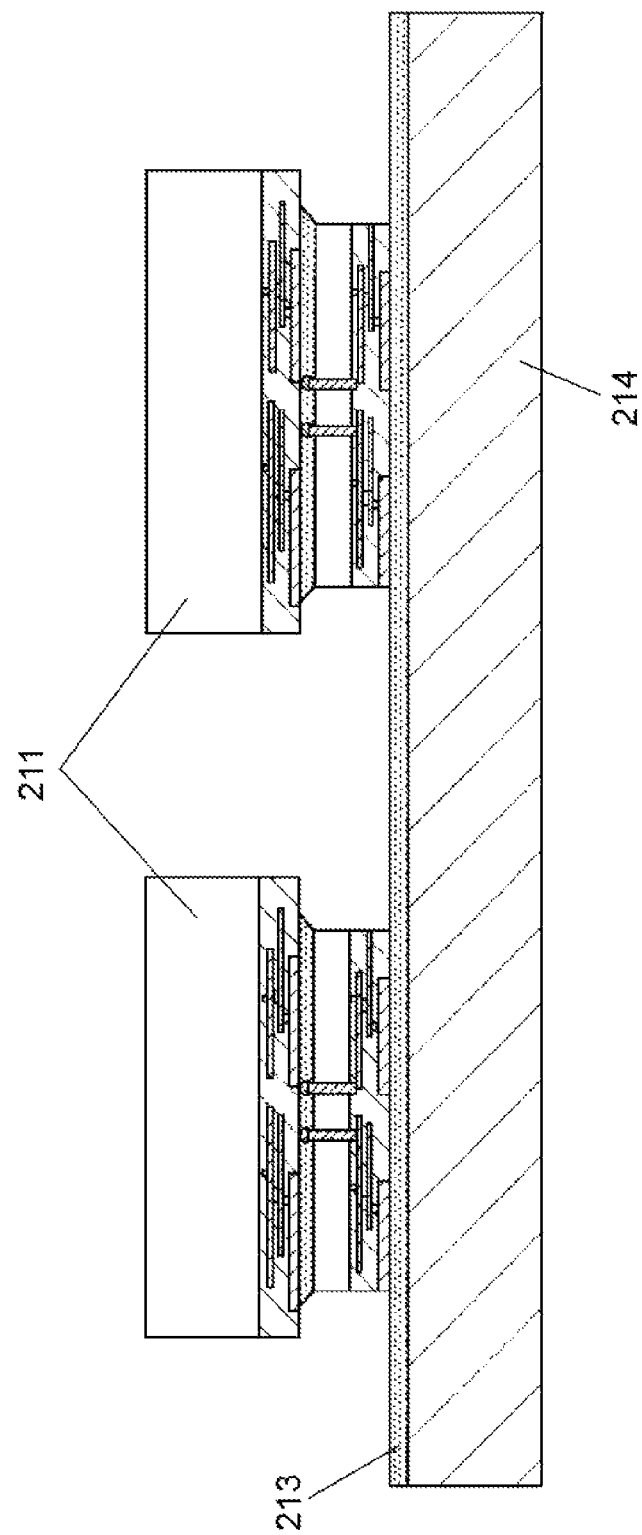

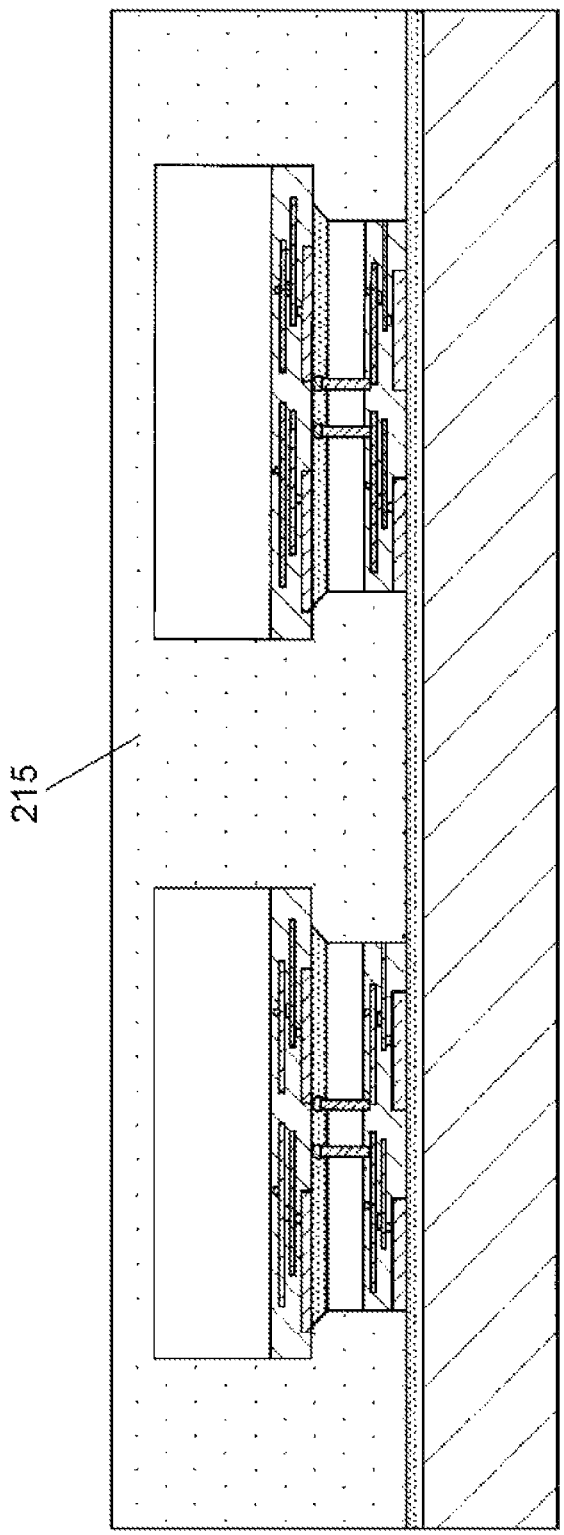

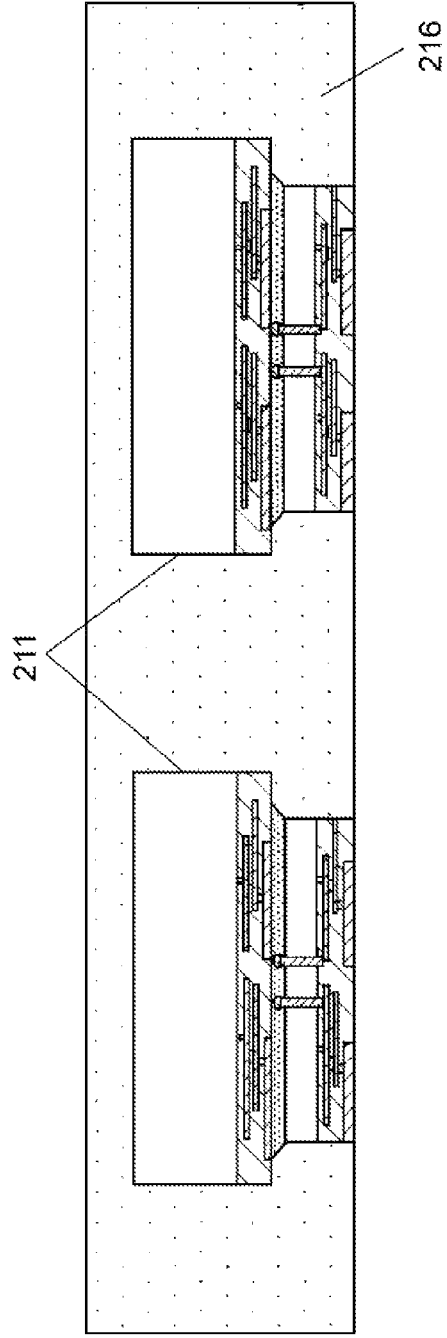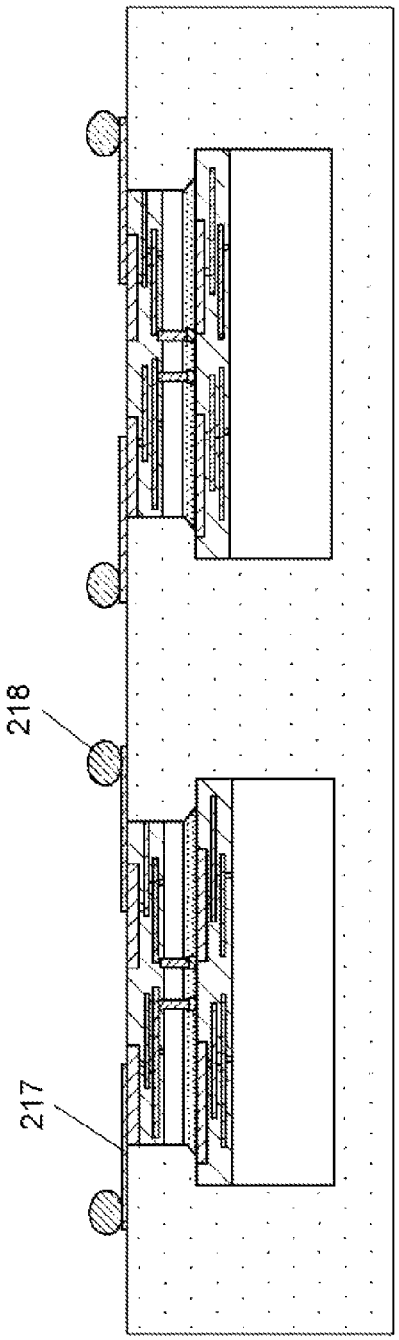

SEMICONDUCTOR DEVICE HAVING STACKED CHIPS, A RE-DISTRIBUTION LAYER, AND PENETRATION ELECTRODES

This is a continuation of International Application No. PCT/JP2013/000071, with an international filing date of Jan. 11, 2012, which claims priority of Japanese Patent Application No. 2012-025777, filed on Feb. 9, 2012, the contents of each of which are hereby incorporated by reference.

BACKGROUND

1. Technical Field

The present disclosure relates to a semiconductor device and a method for manufacturing the semiconductor device, specifically to a semiconductor device including a chip-chip lamination or a chip-wafer lamination.

2. Description of the Related Art

Recently, three-dimensional integration by chip lamination has been disclosed in response to improvement in the integration, enhancement in the functionality, and increase in the speed of semiconductor integrated circuit devices (for example, Unexamined Japanese Patent Publication No. 2006-080145, and ITRS 2007 Assembly and Package Chapter, p. 41).

This is because, in two-dimensional miniaturization as in a conventional system on a chip (SoC) structure, data transmission characteristics are degraded by the increase in wiring resistance caused by reduction in the wiring cross section and the increase in wiring delay caused by increase in the wiring length.

By employing a three-dimensional integration technology of three-dimensionally laminating a semiconductor integrated circuit device, the wiring cross section can be increased and the wiring length can be decreased. In other words, the performance can be improved while the integration degree is increased.

In order to increase the data transmission speed between stacked upper and lower chips, a method is used in which the device surfaces of the upper and lower chips are bonded together (face-to-face) via an external electrode (e.g. micro bump) that is electrically connected to wiring. This method makes the wiring length shortest, and is effective in increasing the transmission speed. Specifically, FIG. 22A shows a conventional, typical wiring lead-out method when the area of the main surface of the lower chip is larger than that of the main surface of the upper chip. FIG. 22B and FIG. 22C show a conventional, typical wiring lead-out method when the area of the main surface of the lower chip is as large as that of the main surface of the upper chip.

FIG. 22A shows the case where the area of the main surface of the lower chip is larger than that of the main surface of the upper chip. FIG. 22B and FIG. 22C show the case where the area of the main surface of the lower chip is as large as that of the main surface of the upper chip. In both cases, the upper chip is bonded to the lower chip via a micro bump, for example. Rewiring 301 (shown by a dotted line in the drawings) led from a central part of the lower chip connects an electrode of the upper chip to a pad of the lower chip.

SUMMARY

In a conventional laminated chip, however, a signal cannot be extracted from the rear surface of the chip to the outside. In order to extract a signal from the conventional laminated chip to the outside, the pad is required to be formed in the region of the lower chip that extends off the upper chip. Then, wiring must be led out, by rewiring, to the periphery of the lower chip that extends off the upper chip. Therefore, the area of the lower chip must be equal to or larger than that of the upper chip. In this method, it is required that wiring is led from the lower chip to a printed board via a wire bond and the distribution layer of the lower chip is directed upward.

Therefore, in all of the conventional technologies of FIG. 22A to FIG. 22C, the wiring length of rewiring 301 led from the central part of the lower chip to the periphery of the lower chip is long, and the influence of IR drop becomes a concern. Especially, the IR drop becomes remarkable as the current value increases, so that this connecting method can be applied to only a low power consumption chip.

Therefore, a lamination method is demanded in which the wiring length of the rewiring on the lower chip is shortened and the reduction in the data transmission speed between the lower chip and upper chip is small.

The present disclosure addresses the above-mentioned problems, and provides a lamination structure and lamination method that increase the data transmission speed between the upper and lower chips while suppressing the IR drop.

In order to address the above-mentioned problems, a semiconductor device of the present disclosure has the configuration described below. The semiconductor device includes the following components:

a first semiconductor chip including a main surface having an element, a rear surface facing the main surface, and penetration electrodes penetrating the main surface and rear surface; and a second semiconductor chip including a main surface having an element and a rear surface facing the main surface.

The first semiconductor chip and second semiconductor chip are stacked via bonding sections so that the rear surface side of the first semiconductor chip faces the main surface side of the second semiconductor chip. At least a part of a side surface of the first semiconductor chip is covered with a first resin. A distribution layer is produced on the plane that is formed of the main surface of the first semiconductor chip and a surface of the first resin. At least part of electrodes existing in the main surface of the second semiconductor chip is electrically connected to at least part of first external electrodes via the penetration electrodes that penetrate the first semiconductor chip. Here, the first external electrodes are formed on the distribution layer.

According to the semiconductor device, the area of the main surface of the first semiconductor chip is different from that of the main surface of the second semiconductor chip.

According to the semiconductor device, the area of the main surface of the first semiconductor chip is smaller than that of the main surface of the second semiconductor chip.

According to the semiconductor device, the thickness of the first semiconductor chip is different from that of the second semiconductor chip.

According to the semiconductor device, the first semiconductor chip is thinner than the second semiconductor chip.

According to the semiconductor device, the first external electrodes are disposed on the distribution layer in both regions of the main surface of the first semiconductor chip and the surface of the first resin.

According to the semiconductor device, the first external electrodes are disposed on the distribution layer on only the surface of the first resin.

According to the semiconductor device, the bonding sections between the first semiconductor chip and the second semiconductor chip are disposed inside the first external electrode that is disposed in the innermost side, of the first external electrodes.

According to the semiconductor device, the penetration electrodes are disposed inside the first external electrode that is disposed in the innermost side, of the first external electrodes.

According to the semiconductor device, the bonding pitch between the bonding sections between the first semiconductor chip and the second semiconductor chip is equal to the pitch between the penetration electrodes.

According to the semiconductor device, the first resin is formed also so as to cover a part of the rear surface of the first semiconductor chip and the periphery of the second semiconductor chip.

According to the semiconductor device, the first resin is formed so as to cover a part of the rear surface of the first semiconductor chip and the main surface of the second semiconductor chip, and expose at least a part of the rear surface or a side surface of the second semiconductor chip.

According to the semiconductor device, two facing side surfaces of the first semiconductor chip are exposed from the first resin.

According to the semiconductor device further includes a second resin that covers a peripheral region of the bonding sections between the first semiconductor chip and the second semiconductor chip.

According to the semiconductor device, a re-distribution layer is formed on the rear surface of the first semiconductor chip.

According to the semiconductor device, a minimum pitch between the first external electrodes is 150 µm or more.

According to the semiconductor device further includes a wiring board that has an electric wiring interconnecting the front surface and rear surface. The first external electrodes are connected to the electric wiring on the front surface side of the wiring board, and external connection electrodes are disposed on the rear surface side thereof. A minimum pitch between the external connection electrodes is 300 µm or more.

According to the semiconductor device, a plurality of second semiconductor chips are stacked.

According to the semiconductor device, of the stacked second semiconductor chips, the rear surface side of the second semiconductor chip formed on the uppermost layer is exposed from the first resin.

According to the semiconductor device, the first semiconductor chip is a logic chip having a logic circuit in its element region, and the second semiconductor chip is a memory chip having a memory circuit in its element region.

A method for manufacturing a semiconductor device of the present disclosure includes following steps (a) to (j). Step (a) includes forming an element region on the main surface of a first semiconductor substrate, and forming penetration electrodes that penetrate the first semiconductor substrate from the main surface side to the rear surface side. Step (b) includes forming a first electrode electrically connected to the end of each of the penetration electrodes that are exposed on the rear surface side of the first semiconductor substrate. Step (c) includes cutting the first semiconductor substrate into first semiconductor chips. Step (d) includes forming an element region on the main surface of a second semiconductor substrate. Step (e) includes producing a first laminated body by bonding the first electrodes that are formed on the rear surface side of first semiconductor chips to second electrodes that are formed in the element region on the main surface side of the second semiconductor substrate. Step (f) includes cutting the second semiconductor substrate of the first laminated body into second laminated bodies. Step (g) includes pasting the main surface side of the first semiconductor chips of the second laminated bodies on a support substrate. Step (h) includes molding, with resin, the peripheries of the second laminated bodies pasted on the support substrate. Step (i) includes peeling the second laminated bodies and the resin around them from the support substrate. Step (j) includes forming distribution layers and external electrodes connected to the distribution layers on the plane that is formed of the surface of the resin and the main surfaces of the first semiconductor chips of the second laminated bodies.

According to the method for manufacturing a semiconductor device of the present disclosure includes following steps (a) to (e), and steps (k) to (n). Step (a) includes forming an element region on the main surface of a first semiconductor substrate, and forming penetration electrodes that penetrate the first semiconductor substrate from the main surface side to the rear surface side. Step (b) includes forming a first electrode electrically connected to the end of each of the penetration electrodes that are exposed on the rear surface side of the first semiconductor substrate. Step (c) includes cutting the first semiconductor substrate into first semiconductor chips. Step (d) includes forming an element region on the main surface of a second semiconductor substrate. Step (e) includes producing a first laminated body by bonding the first electrodes that are formed on the rear surface side of the first semiconductor chips to second electrodes that are formed in the element region on the main surface side of the second semiconductor substrate. Step (k) includes molding a periphery of the first laminated body using resin. Step (l) includes removing an upper part of the resin to expose the main surface of each first semiconductor chip of the first laminated body, and forming a plane using the main surface of each first semiconductor chip and a surface of the resin. Step (m) includes forming distribution layers and external electrodes connected to the distribution layers on the plane that is formed of the surface of the resin and the main surfaces of the first semiconductor chips of the first laminated body. Step (n) includes cutting the second semiconductor substrate of the first laminated body into second laminated bodies.

According to the semiconductor device and a method for manufacturing the semiconductor device in accordance with the present disclosure, high-speed transmission of a signal between the upper and lower chips is enabled by a silicon penetration via-hole in a chip lamination package of chip-on-chip type. Furthermore, an external output terminal having a fan out structure is produced by forming a resin expansion region on the lower chip. Therefore, of the wirings led from both of the upper chip and lower chip to the outside, the wiring apt to be affected by wiring delay or IR drop can be set to be the shortest. As a result, a layout having a short wiring length is enabled.

BRIEF DESCRIPTION OF DRAWINGS

FIG. 16 is still another process sectional view showing the method for manufacturing the first semiconductor device in accordance with the first and second exemplary embodiment;

FIG. 17 is still another process sectional view showing the method for manufacturing the first semiconductor device in accordance with the first and second exemplary embodiment;

FIG. 18A is still another process sectional view showing the method for manufacturing the first semiconductor device in accordance with the first and second exemplary embodiment;

FIG. 18B is still another process sectional view showing the method for manufacturing the first semiconductor device in accordance with the first and second exemplary embodiment;

DESCRIPTION OF EMBODIMENTS

A semiconductor device and a method for manufacturing the semiconductor device in accordance with exemplary embodiments of the present disclosure are described with reference to drawings.

First Exemplary Embodiment

Semiconductor Device

Figure 1:
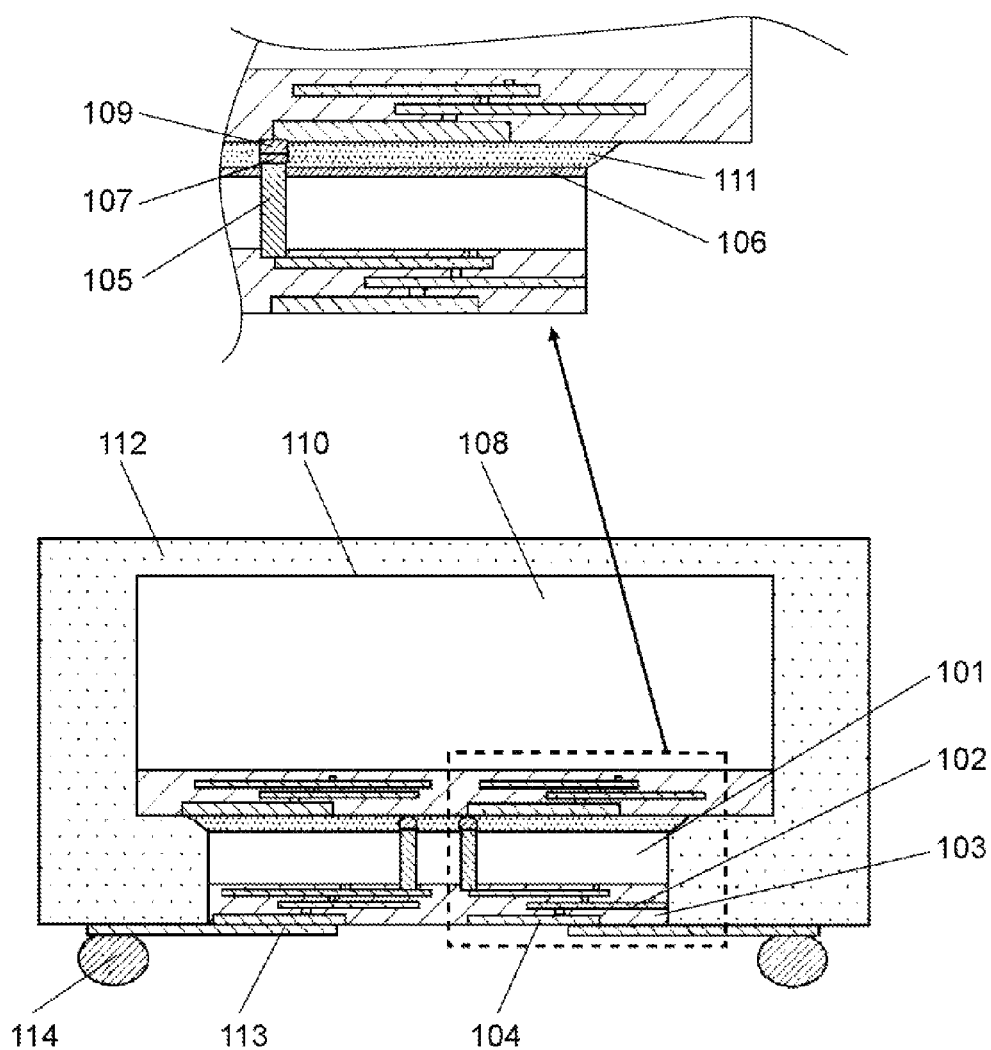
FIG. 1 is a sectional view showing a semiconductor device in accordance with a first exemplary embodiment.

FIG. 1 is a sectional view showing a semiconductor device in accordance with the first exemplary embodiment.

As shown in FIG. 1, first semiconductor chip 101 that is made of silicon, for example, and has a main surface of 6 mm☐ is prepared. An element (not shown) such as a transistor and distribution layer 104 are formed on the main surface (front surface side) of first semiconductor chip 101. Distribution layer 104 includes wiring 102 electrically connected to the element and inter-layer insulating film 103 covering the element. First semiconductor chip 101 includes silicon penetration electrodes 105 that are connected to a part of wiring 102 and have a diameter of 5 µm and a depth of 50 µm, for example.

First semiconductor chip 101 is thinned to a thickness of 50 µm or less, for example, by polishing the silicon on the rear surface side. Conductive surfaces of the bottoms of silicon penetration electrodes 105 are exposed on the rear surface of first semiconductor chip 101. The thickness of first semiconductor chip 101 is reduced to 50 µm or less, so that the opening diameter of silicon penetration electrodes 105 can be reduced to about 5 µm. This is because it is technically-difficult to form a silicon penetration via-hole whose aspect ratio is higher than 10.

First semiconductor chip 101 is electrically connected to second semiconductor chip 108 using a fine silicon penetration via-hole that can be achieved by thinning first semiconductor chip 101. Thus, a chip-on-chip structure where reduction in data transmission speed is small can be formed. Furthermore, the region of the silicon penetration via-hole in first semiconductor chip 101 can be reduced, and the increase in the chip area in first semiconductor chip 101 can be suppressed. Therefore, the chip cost can be reduced.

Furthermore, the rear surface of first semiconductor chip 101 except the conductive surfaces of the bottoms of silicon penetration electrodes 105 is covered with insulating film 106, and the insulating property is kept. Insulating film 106 has a thickness of 100 nm, for example, and is formed of a nitride film.

First electrode 107 is formed on the exposed conductive surface of each silicon penetration electrode 105, and is connected to it directly or by rewiring. Second semiconductor chip 108 is stacked on first semiconductor chip 101, and has a main surface of 9 mm☐. A device (not shown) formed on the main surface (front surface side) of second semiconductor chip 108 is a Wide I/O DRAM (input/output dynamic random access memory), for example. In this case, first electrodes 107 are arranged in accordance with a standard interface disposed in the center of the chip. As second semiconductor chip 108, a memory chip on which another memory circuit is mounted may be employed.

First electrodes 107 have a height of 10 µm and a diameter of 10 µm, and the pitch between first electrodes 107 is 20 µm. First electrodes 107 are disposed so as to be bonded to second electrodes 109 previously formed on the main surface side of second semiconductor chip 108.

First electrodes 107 on the rear surface of first semiconductor chip 101 are pasted to second electrodes 109 on the main surface of second semiconductor chip 108 in a face-to-face manner. Thus, first semiconductor chip 101 and second semiconductor chip 108 constitute first laminated body 110. The clearance between first semiconductor chip 101 and second semiconductor chip 108 is filled with adhesive 111, for example.

The periphery of first laminated body 110 except the main surface of first semiconductor chip 101 is molded with first resin 112. On the main surface of first semiconductor chip 101, re-distribution layers 113 extending to the surface of first resin 112 that is formed around first semiconductor chip 101 are formed. First external electrode 114 is formed on the part of each re-distribution layer 113 that extends to the surface of first resin 112.

Each first external electrode 114 is an external connection terminal of first laminated body 110 and is connected to a signal line, a power supply line, or a ground line. A fan out region is formed of the main surface of first semiconductor chip 101 and the surface of first resin 112 that is disposed around first semiconductor chip 101 and includes re-distribution layer 113.

Thus, a region including a chip distribution layer and a resin expansion region is used as a re-distribution layer, so that the re-distribution layer serves as an interposer. Therefore, a dedicated interposer is not required and cost reduction is enabled.

By optimizing the layout of first external electrodes 114 in the fan out region, the IR drop and transmission speed can be optimized. In other words, the resin expansion regions of first semiconductor chip (lower chip) 101 are used as regions on which external electrodes are formed. Thus, of the wirings led from both of first semiconductor chip (lower chip) 101 and second semiconductor chip (upper chip) 108 to the outside, the wiring apt to be affected by wiring delay or IR drop can be set to be the shortest. Thus, a layout that shortens the wiring for extracting a signal to the outside is enabled.

The main surfaces of first semiconductor chip (lower chip) 101 and second semiconductor chip (upper chip) 108 that are stacked may have the same area or different areas. Thus, in response to the handleability of the semiconductor device or a request from an application thereof or the like, a desired semiconductor device can be achieved.

More specifically, the present exemplary embodiment describes the case where the area of the main surface of first semiconductor chip (lower chip) 101 is smaller than that of the main surface of second semiconductor chip (upper chip) 108. Re-distribution layer 113 is formed on the plane that is formed of the main surface of first semiconductor chip (lower chip) 101 and first resin 112 around it. Thanks to re-distribution layer 113, the region where first external electrodes 114 can be formed can be made larger than second semiconductor chip (upper chip) 108. Thus, the restriction by the size of the stacked semiconductor chips is eliminated, and a desired arrangement of the external electrodes is enabled.

First semiconductor chip (lower chip) 101 and second semiconductor chip (upper chip) 108 may have different chip thicknesses. Thus, in response to a restriction on the handling of the semiconductor device or a request from an application thereof or the like, a desired semiconductor device can be achieved.

Preferably, first semiconductor chip (lower chip) 101 is thinner than second semiconductor chip (upper chip) 108. More specifically, preferably, the thickness of first semiconductor chip (lower chip) 101 including silicon penetration electrodes 105 is 50 µm or less. Thus, fine silicon penetration electrodes 105 of a diameter of about 5 µm can be easily processed. In this case, preferably, the thickness of second semiconductor chip (upper chip) 108 is 100 µm or more. Thus, the rigidity of the whole semiconductor device as first laminated body 110 can be kept.

(First Example of Arrangement of First External Electrodes 114)

Figure 2:
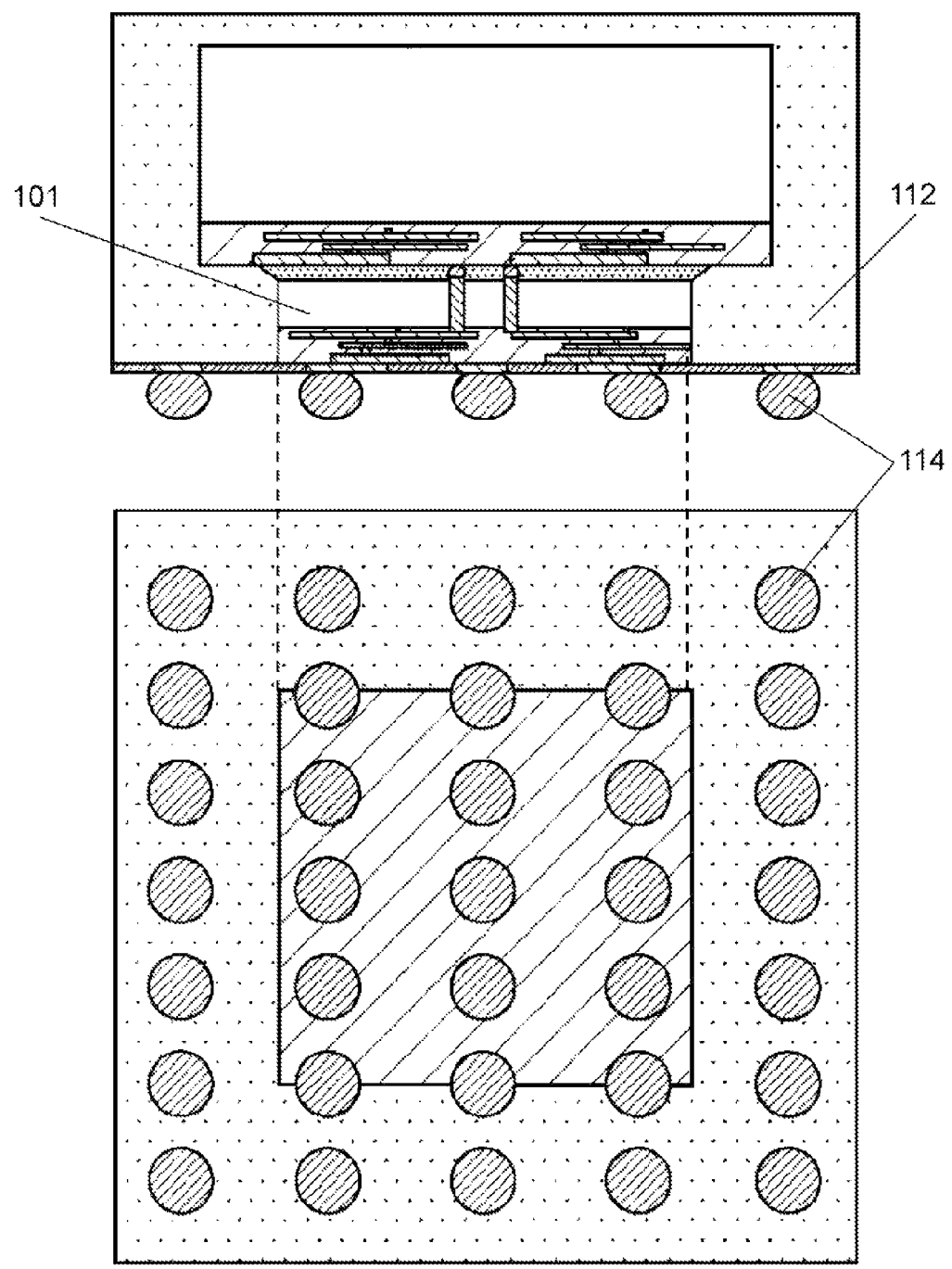
FIG. 2 is a sectional view and bottom view showing a first example of the arrangement of first external electrodes in the semiconductor device in accordance with the first exemplary embodiment.

The arrangement places of first external electrodes 114 are not limited to the region on re-distribution layers 113 that extend to the surface of first resin 112 (shown in FIG. 1). For example, as shown in FIG. 2, first external electrodes 114 may be arranged on the whole surfaces of first semiconductor chip 101 and first resin 112 around it.

In such a structure, a larger number of terminals can be arranged, and the terminal storing performance of the semiconductor device can be improved.

(Second Example of Arrangement of First External Electrodes 114)

Figure 3:
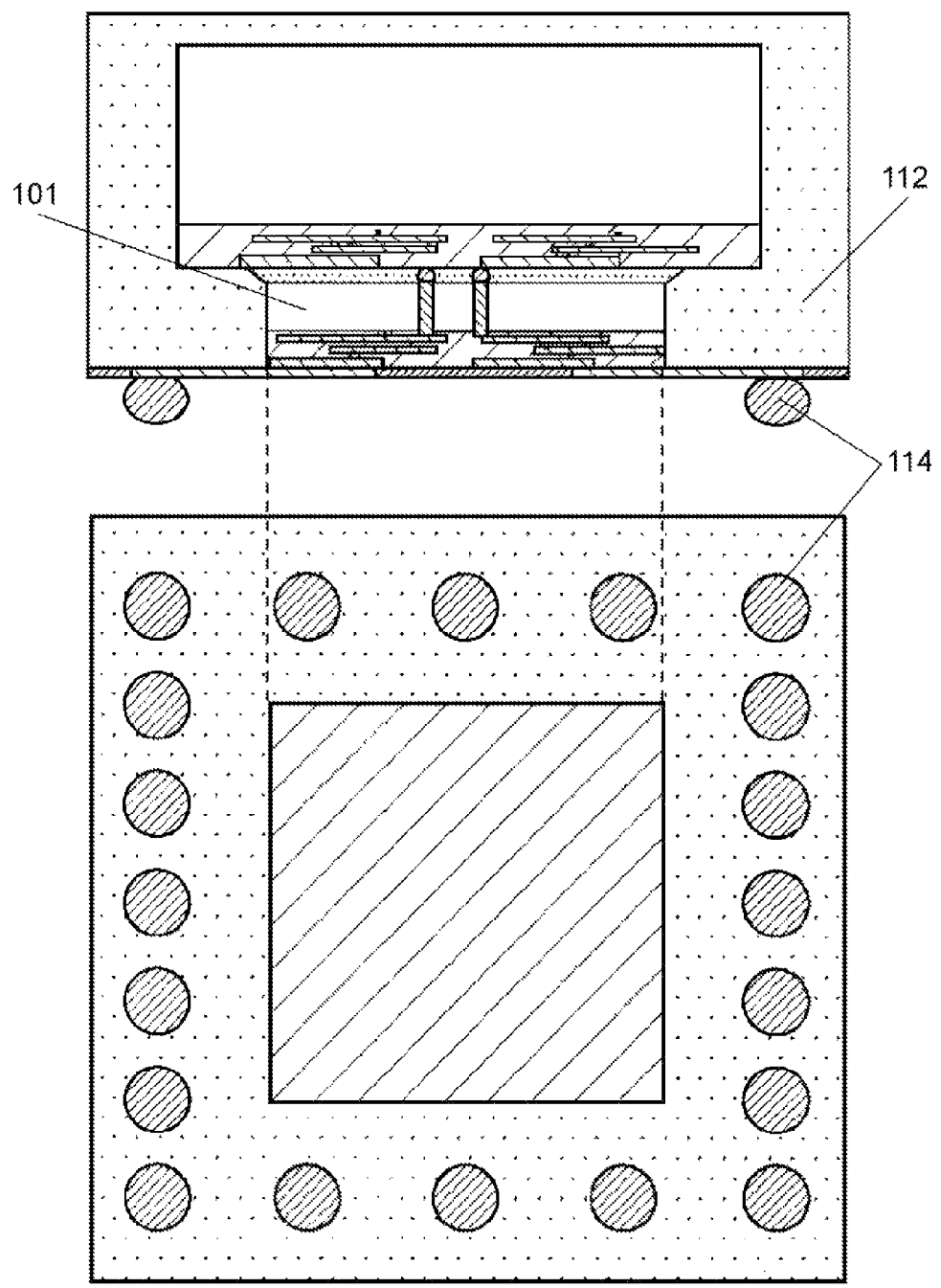
FIG. 3 is a sectional view and bottom view showing a second example of the arrangement of the first external electrodes in the semiconductor device in accordance with the first exemplary embodiment.

As shown in FIG. 3, in the plan view, first external electrodes 114 may be arranged only on first resin 112, which does not overlap first semiconductor chip 101.

(Third Example of Arrangement of First External Electrodes 114)

Figure 4:
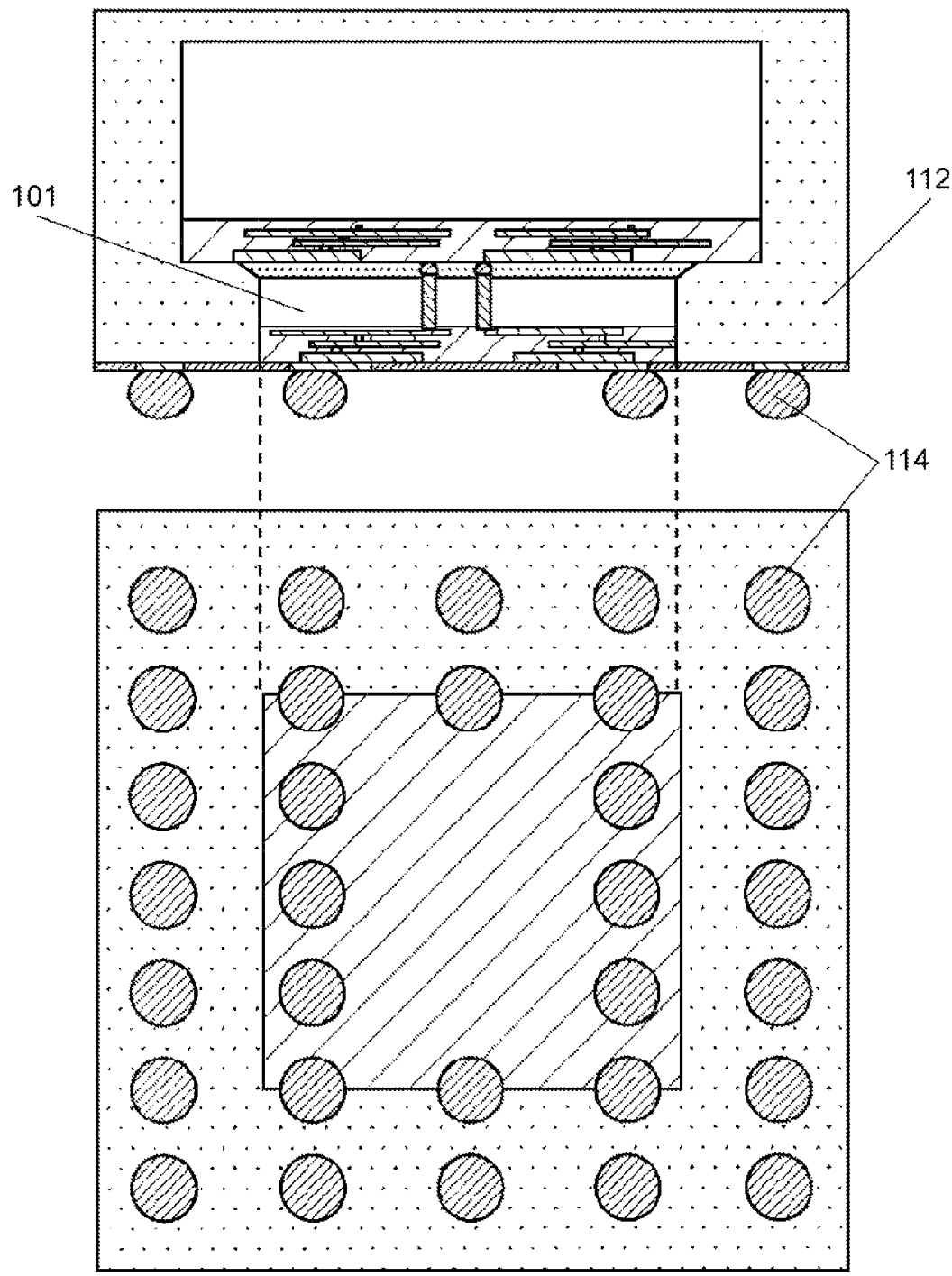
FIG. 4 is a sectional view and bottom view showing a third example of the arrangement of the first external electrodes in the semiconductor device in accordance with the first exemplary embodiment.

As shown in FIG. 4, first external electrodes 114 may be restrictively arranged on the surface of first semiconductor chip 101 that does not overlap at least silicon penetration electrodes 105 and on the surface of first resin 112 around first semiconductor chip 101.

Usually, silicon penetration electrodes 105 are concentratedly disposed at a pitch of about 20 µm in a region of about 5 nm×0.8 mm near the center of first semiconductor chip 101. Therefore, as shown in FIG. 3 and FIG. 4, silicon penetration electrodes 105 and first external electrodes 114 can be arranged so that they do not overlap each other. Thus, when first external electrodes 114 are mounted on a wiring board or the like, the influence of the stresses occurring in silicon penetration electrodes 105 that are disposed at a fine pitch and occurring in the bonding sections can be minimized.

First Modified Example of First Exemplary Embodiment

Figure 5:
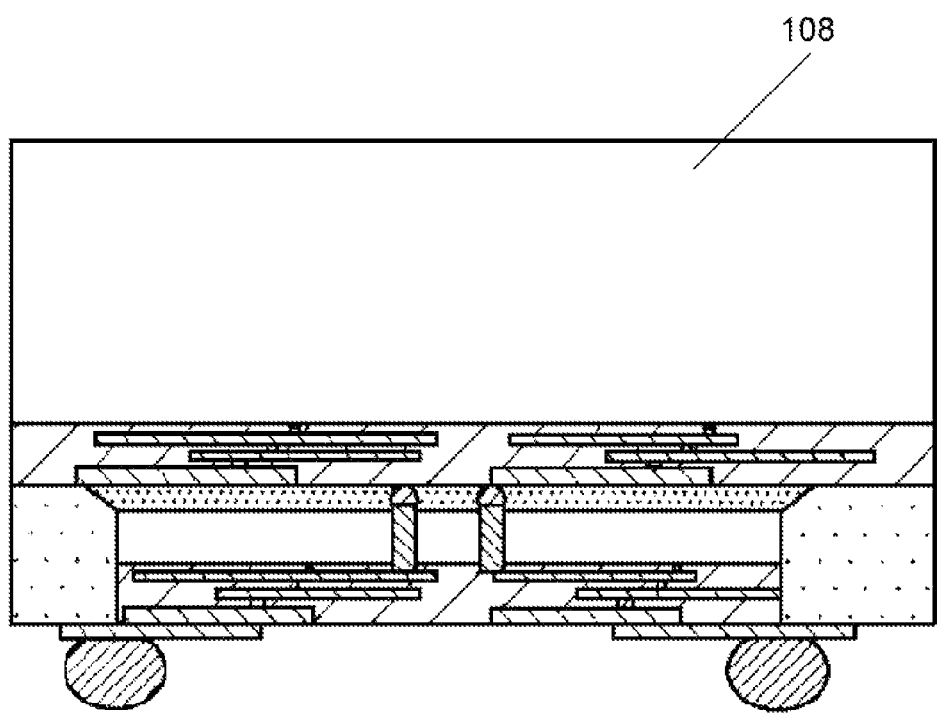
FIG. 5 is a sectional view showing a first modified example of the semiconductor device in accordance with the first exemplary embodiment.

As shown in FIG. 5, the rear surface and side surfaces of second semiconductor chip 108 may be exposed. This structure can be easily achieved by a process of polishing the rear surface after the sealing, or a process of protecting the rear surface with a sheet before the sealing, and peeling the sheet after the sealing. Also in FIG. 1 to FIG. 4, the rear surface of second semiconductor chip 108 may be exposed.

In such a structure, heat can be directly radiated to the periphery (in air) through the chip rear surface. Furthermore, a radiator plate, a heat sink, or a fin can be bonded to the chip rear surface, so that a large radiation path can be secured. As a result, a semiconductor device of high radiation property can be provided.

Second Modified Example of First Exemplary Embodiment

Figure 6:
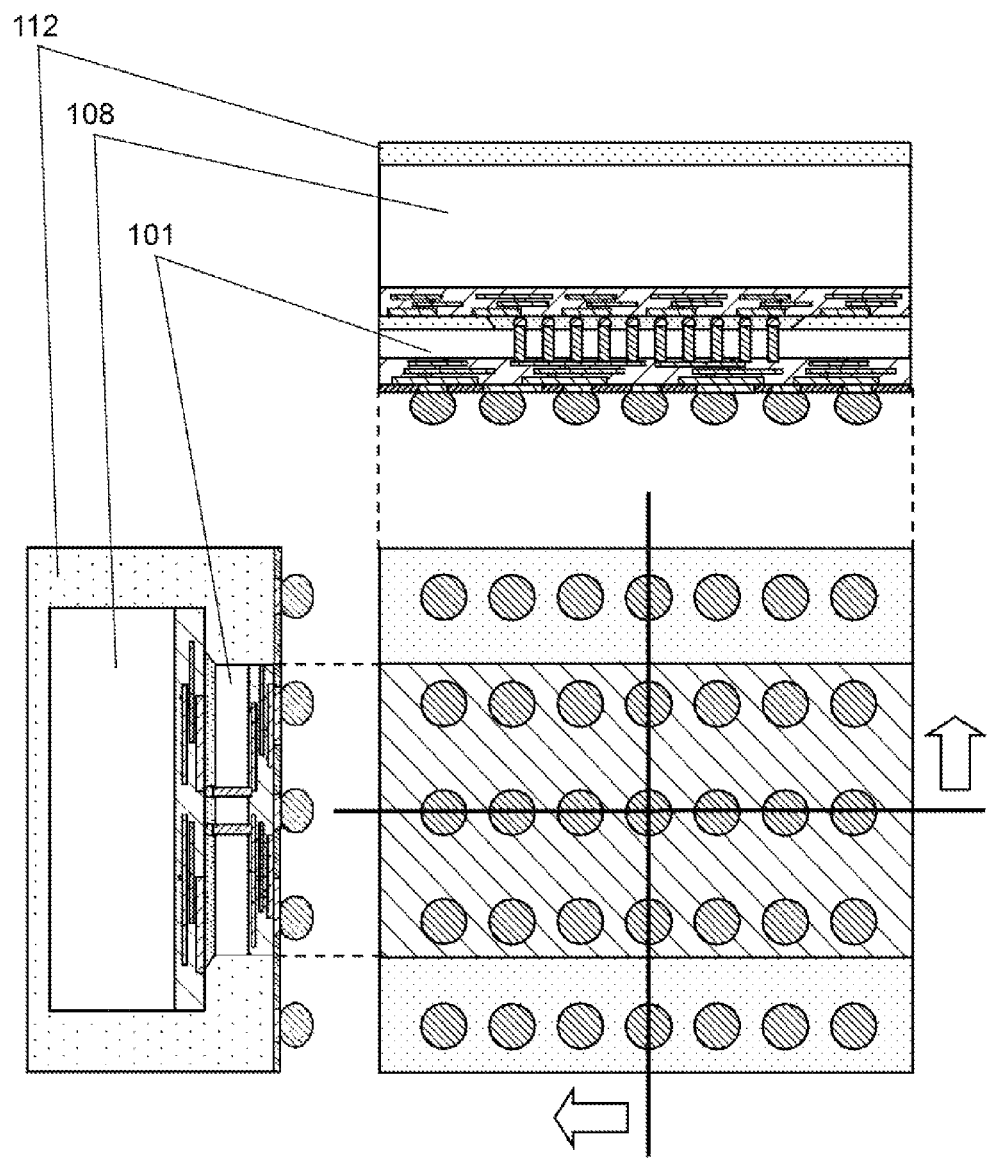
FIG. 6 is a sectional view showing a second modified example of the semiconductor device in accordance with the first exemplary embodiment.

As shown in FIG. 6, two facing side surfaces of first semiconductor chip 101 may be exposed from first resin 112. In this case, two facing side surfaces other than the exposed two facing side surfaces are covered with first resin 112. In FIG. 6, the rear surface of second semiconductor chip 108 is covered with first resin 112, and side surfaces of second semiconductor chip 108 are exposed. However, the rear surface of second semiconductor chip 108 may be exposed (not shown) as in the first modified example. The side surfaces of second semiconductor chip 108 may be covered with first resin 112 (not shown).

Third Modified Example of First Exemplary Embodiment

Figure 7:
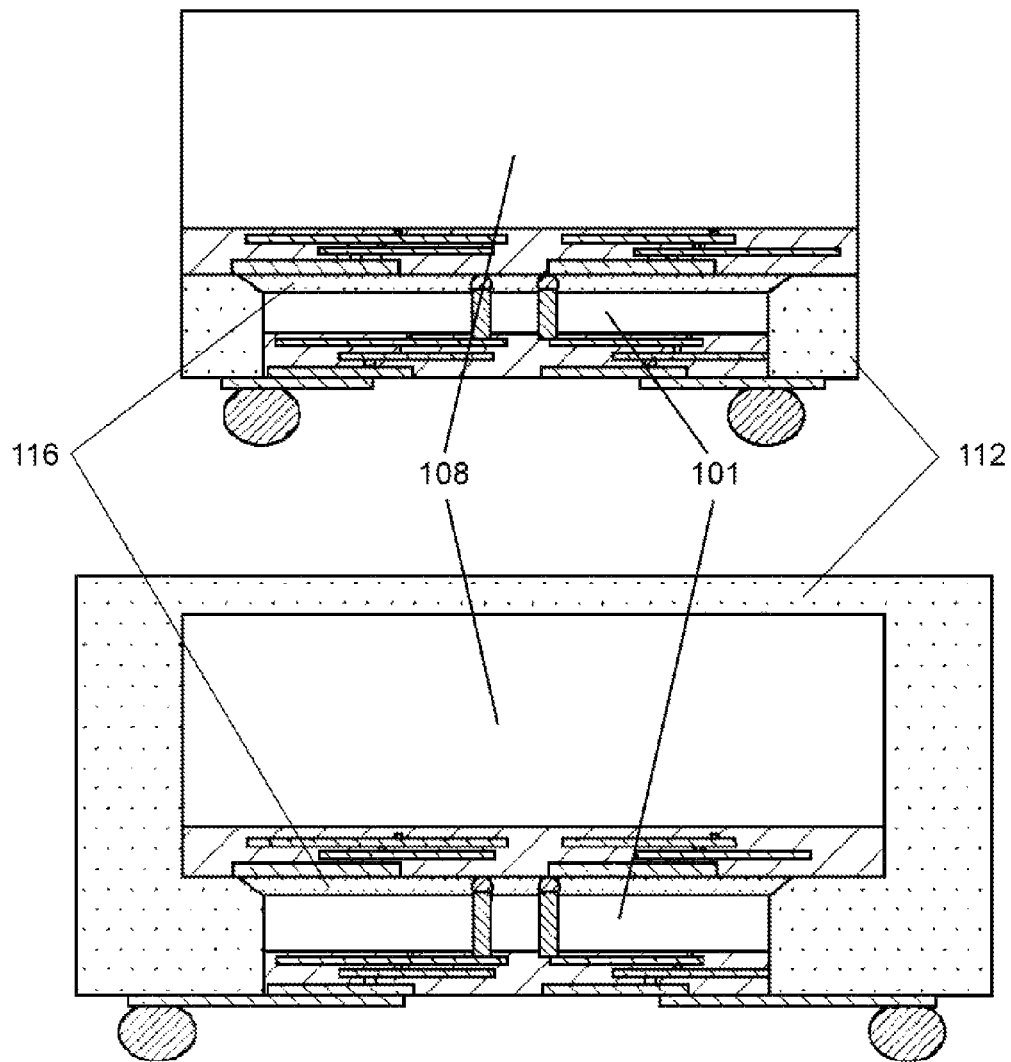
FIG. 7 is a sectional view showing a third modified example of the semiconductor device in accordance with the first exemplary embodiment.

As shown in FIG. 7, adhesive 111 of FIG. 1 may be second resin 116. In this case, first resin 112 and second resin 116 may be made of the same material and may be formed simultaneously. First resin 112 and the second resin may be made of the same material and may be formed separately. First resin 112 and second resin 116 may be made of different materials and may be formed separately.

In such a structure, the handling when a semiconductor device including first laminated body 110 is mounted on another wiring board is facilitated. The connection reliability of the bonding sections between first semiconductor chip 101 and second semiconductor chip 108 after the mounting can be easily secured.

Fourth Modified Example of First Exemplary Embodiment

Figure 8:
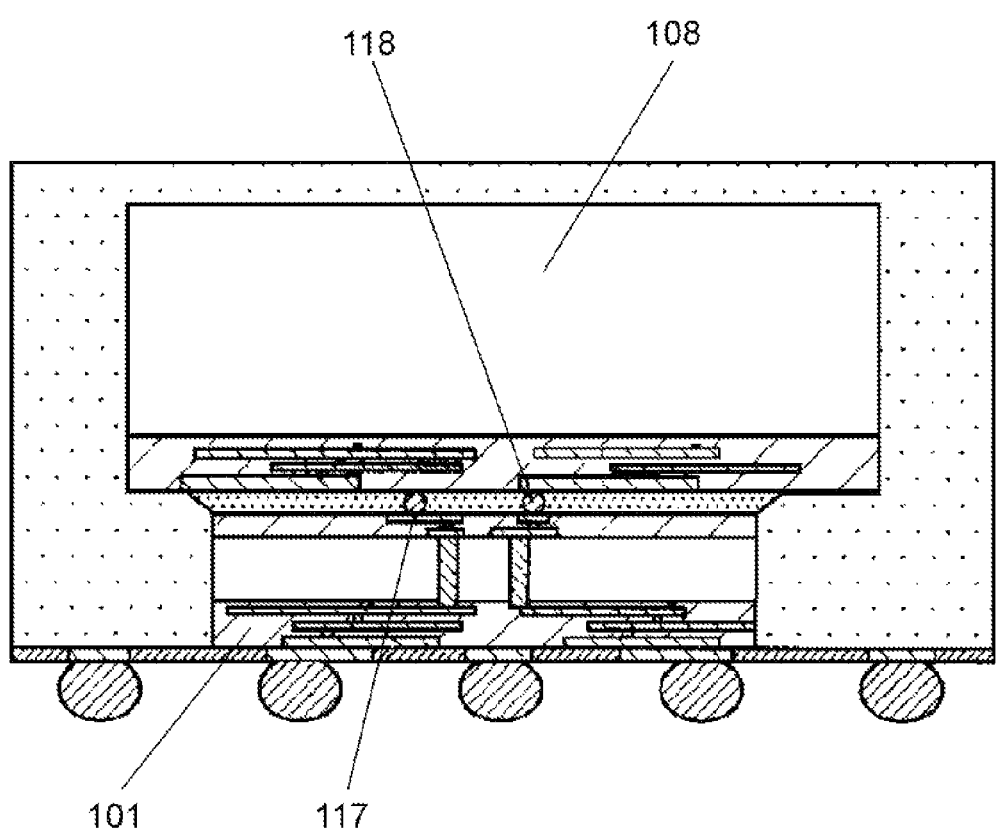
FIG. 8 is a sectional view showing a fourth modified example of the semiconductor device in accordance with the first exemplary embodiment.

As shown in FIG. 8, re-distribution layer 117 may be disposed on the rear surface of first semiconductor chip 101. Re-distribution layer 117 is formed by rewiring by Cu wiring from a penetration electrode section on the rear surface of first semiconductor chip 101. Second external electrodes 118 are formed at ends of the rewiring, and are bonded to the external electrodes of second semiconductor chip 108. On the Cu wiring, a protective insulating film such as polyimide or solder resist may be formed.

In such a structure, second external electrodes 118 of first semiconductor chip 101 can be easily bonded to the external electrodes of second semiconductor chip 108 without changing the pitch between the external electrodes of second semiconductor chip 108.

Fifth Modified Example of First Exemplary Embodiment

Figure 9:
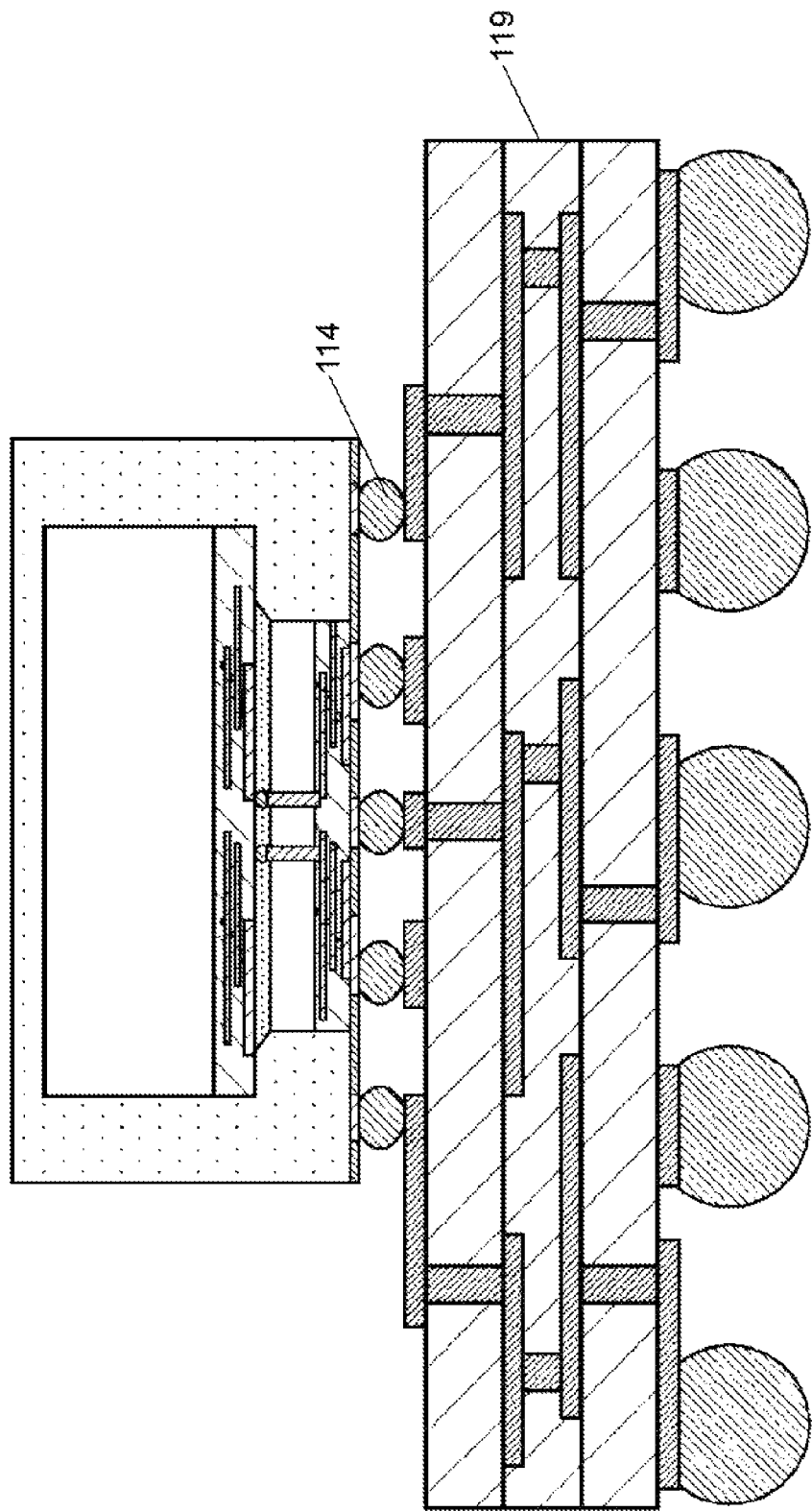
FIG. 9 is a sectional view showing a fifth modified example of the semiconductor device in accordance with the first exemplary embodiment.

As shown in FIG. 9, for example, when the pitch between first external electrodes 114 is 150 μm or more, a relatively inexpensive substrate manufactured in a low-cost process such as a subtract method can be used as a substrate on which the semiconductor device is mounted, and a substrate having undergone electrolytic plating as a surface treatment can be used as wiring board 119. Wiring board 119 includes electric wiring that interconnects its front surface and rear surface. First external electrodes 114 are connected to the electric wiring on the front surface, and external connection electrodes are connected to the electric wiring on the rear surface. The minimum pitch between the external connection electrodes is 300 μm or more. In this case, a substrate having a low linear expansion coefficient, for example $\alpha=3$ to 15 ppm/° C., is employed.

The thickness of wiring board 119 may be set smaller than 0.3 mm, which is the sum total of the thickness (50 μm) of first semiconductor chip 101 and the thickness (250 μm) of second semiconductor chip 108. The thickness of wiring board 119 may be set smaller than 0.2 mm, which is the sum total of the thickness (50 μm) of first semiconductor chip 101 and the thickness (150 μm) of second semiconductor chip 108.

In such a structure, a semiconductor device can be provided in which the total thickness of first laminated body 110 is small and the camber of wiring board 119 and the whole product is small. The chip total thickness of first laminated body 110 is greater than the thickness of wiring board 119, and hence the rigidity can be kept. Therefore, without being affected by the camber of wiring board 119, the bonding quality of the bonding sections of silicon penetration electrodes 105 and first external electrodes 114 can be kept.

Above-mentioned descriptions have shown that second semiconductor chip 108 is formed of a single layer, but the second semiconductor chip may be formed by stacking a plurality of semiconductor chip layers. In this case, the rear surface of the second semiconductor chip indicates the rear surface of the uppermost semiconductor chip layer. The main surface of the second semiconductor chip indicates the main surface of the lowermost semiconductor chip layer.

The first semiconductor chip may be a logic chip on which a logic circuit is mounted.

Method 1 for Manufacturing Semiconductor Device

FIG. 10 to FIG. 19 are process sectional views showing a method for manufacturing a first semiconductor device in accordance with the first exemplary embodiment.

Figure 10:
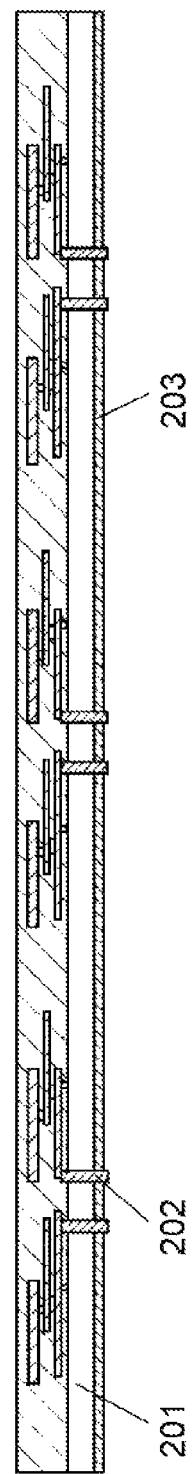
FIG. 10 is a process sectional view showing a method for manufacturing a first semiconductor device in accordance with a first and second exemplary embodiment.

As shown in FIG. 10, first silicon substrate 201 made of silicon, for example, is prepared. Elements (not shown), such as transistors, and distribution layers are formed on the front surface side of first silicon substrate 201. Each distribution layer includes wiring electrically connected to each element such as a transistor and an inter-layer insulating film covering the element. First silicon substrate 201 includes silicon penetration electrodes 202 that are connected to part of the distribution layers and have a diameter of 5 μm and a depth of 50 μm. The silicon on the rear surface side of first silicon substrate 201 is polished to thin the first silicon substrate 201 to a thickness of 50 μm or less, for example. Conductive surfaces of the bottoms of silicon penetration electrodes 202 are exposed on the rear surface of first silicon substrate 201. The rear surface of first silicon substrate 201 except the conductive surfaces of the bottoms of silicon penetration electrodes 202 is covered with insulating film 203, and insulating property is kept. Insulating film 203 has a thickness of 100 nm, for example, and is formed of a silicon nitride film. Thus, the thickness of first silicon substrate 201 is reduced to 50 μm or less, for example, so that the opening diameter of the silicon penetration via-holes constituting silicon penetration electrodes 202 can be reduced to about 5 μm. This is because it is technically-difficult to form a silicon penetration via-hole whose aspect ratio is higher than 10. By the reduction in diameter, the total region of the silicon penetration electrodes 202 in the first semiconductor chip can be reduced. Thus, the increase in the chip area in the first semiconductor chip can be suppressed, and the chip cost can be reduced.

Figure 11:
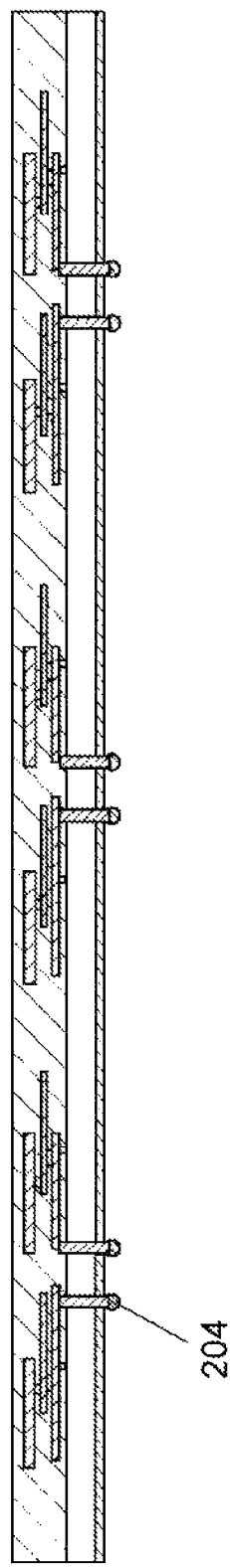
FIG. 11 is another process sectional view showing the method for manufacturing the first semiconductor device in accordance with the first and second exemplary embodiment.

Next, as shown in FIG. 11, first electrodes 204 are formed which are directly or by rewiring connected to the exposed conductive surfaces of the bottoms of silicon penetration electrodes 202. First electrodes 204 are formed on first silicon substrate 201. First silicon substrate 201 is divided into a plurality of first semiconductor chips 209 in a later process. Each of first semiconductor chips 209 includes first electrodes 204. First electrodes 204 are connected to second electrodes 208 of second semiconductor chip 212 formed in a later process.

For example, when second semiconductor chip 212 is a Wide I/O DRAM, first electrodes 204 are disposed in the center of the chip and arranged in accordance with a standard interface. First electrodes 204 have a height of 10 µm and a diameter of 10 µm, and the pitch between first electrodes 204 is 20 µm, for example.

Figure 12:
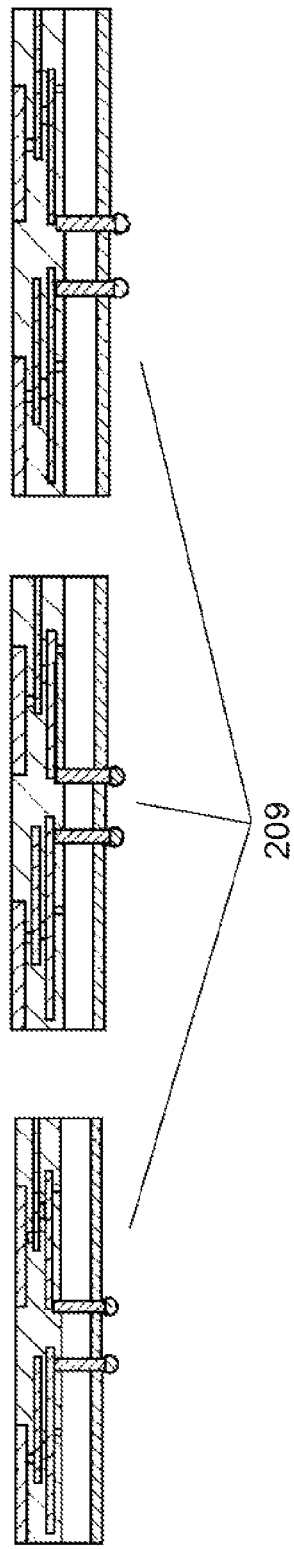
FIG. 12 is yet another process sectional view showing the method for manufacturing the first semiconductor device in accordance with the first and second exemplary embodiment.

Next, as shown in FIG. 12, first silicon substrate 201 is diced into a plurality of first semiconductor chips 209.

Figure 13:
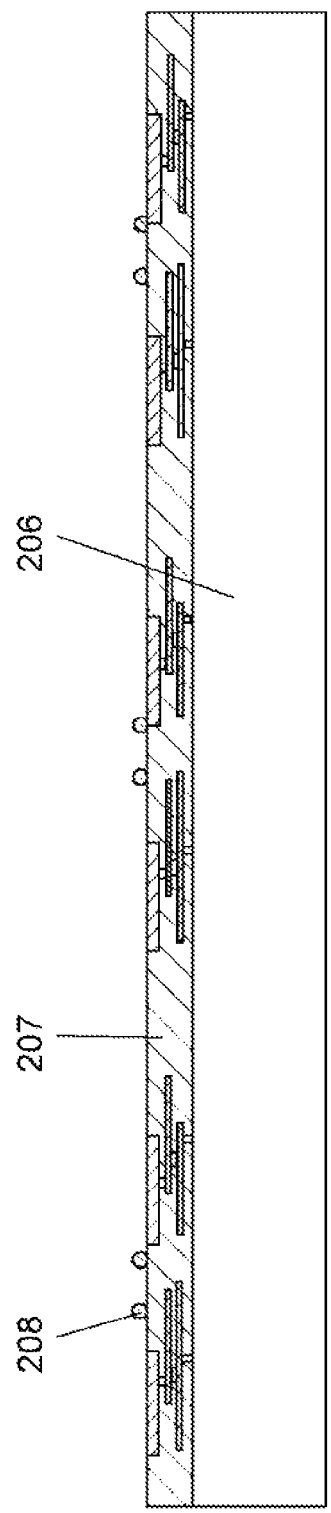
FIG. 13 is still another process sectional view showing the method for manufacturing the first semiconductor device in accordance with the first and second exemplary embodiment.

Next, as shown in FIG. 13, second silicon substrate 206 made of silicon is prepared, for example. Elements such as transistors and distribution layers are formed on the front surface side of second silicon substrate 206 (partially shown). Each distribution layer includes a wiring electrically connected to each element such as a transistor and an inter-layer insulating film covering the element. Second semiconductor chip 212 is formed of these components. Second electrodes 208 are formed on second semiconductor chip 212.

Figure 14:
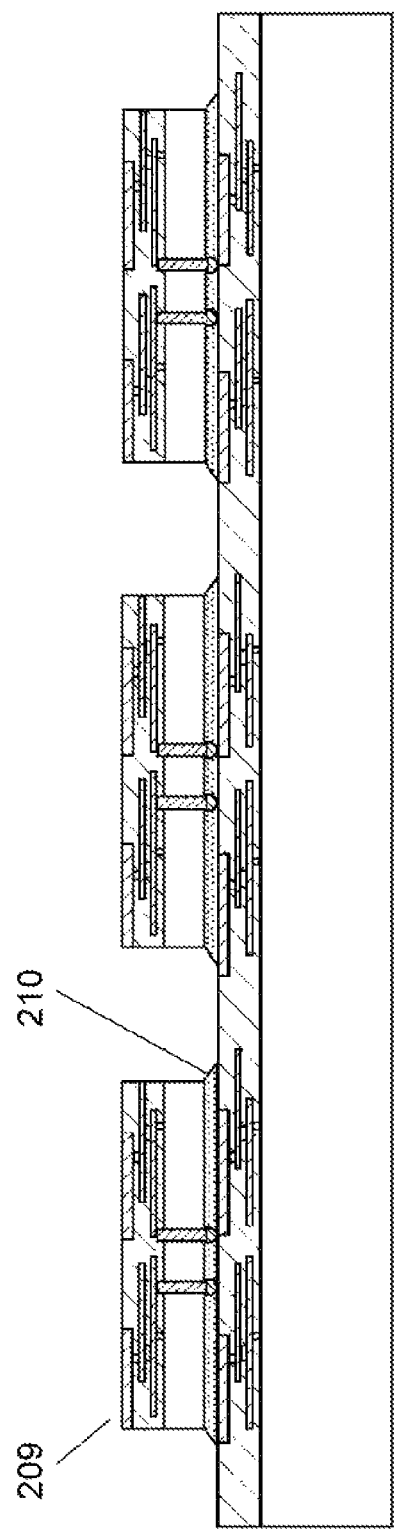
FIG. 14 is still another process sectional view showing the method for manufacturing the first semiconductor device in accordance with the first and second exemplary embodiment.

Next, as shown in FIG. 14, a plurality of first semiconductor chips 209 are pasted on second silicon substrate 206 in a chip-to-wafer manner so that first electrodes 204 are connected to second electrodes 208. At this time, for example, adhesive 210 is filled into clearances formed between first semiconductor chips 209 and second semiconductor chip 212 that face each other.

Figure 15:
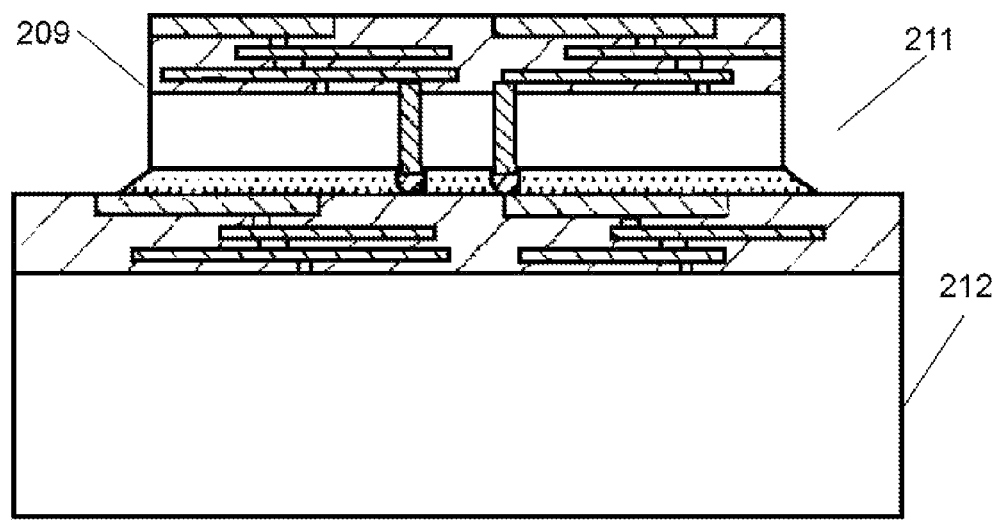
FIG. 15 is still another process sectional view showing the method for manufacturing the first semiconductor device in accordance with the first and second exemplary embodiment.

Next, as shown in FIG. 15, second silicon substrate 206 is diced into first laminated bodies 211 so that first semiconductor chip 209 and second semiconductor chip 212 that are connected to each other form a pair. Thus, by stacking thinned first semiconductor chip 209 and thick second semiconductor chip 212, second semiconductor chip 212 serves as a support body of first semiconductor chip 209. Thus, an influence of the stress generated by packaging on first semiconductor chip 209 can be reduced.

Next, as shown in FIG. 16, the distribution layer side of first semiconductor chips 209 in first laminated bodies 211 is pasted on support substrate 214 having adhesive layer 213 at a desired interval. Based on the pasting interval, the area of the fan out region of each first laminated body 211 can be set.

Next, as shown in FIG. 17, first laminated bodies 211 and support substrate 214 on which they are pasted are integrally molded using first resin 215.

Next, as shown in FIG. 18A, first resin 215 including a plurality of first laminated bodies 211 is peeled from support substrate 214, and first restructured wafer 216 constituted by a plurality of first laminated bodies 211 is formed. Then, as shown in FIG. 18B, first re-distribution layers 217 that are connected to the distribution layers are formed so that each first re-distribution layer 217 covers each distribution layer of each first laminated body 211 and first resin 215 around each first laminated body 211. First external electrodes 218 connected to first re-distribution layers 217 are also formed.

Figure 19:
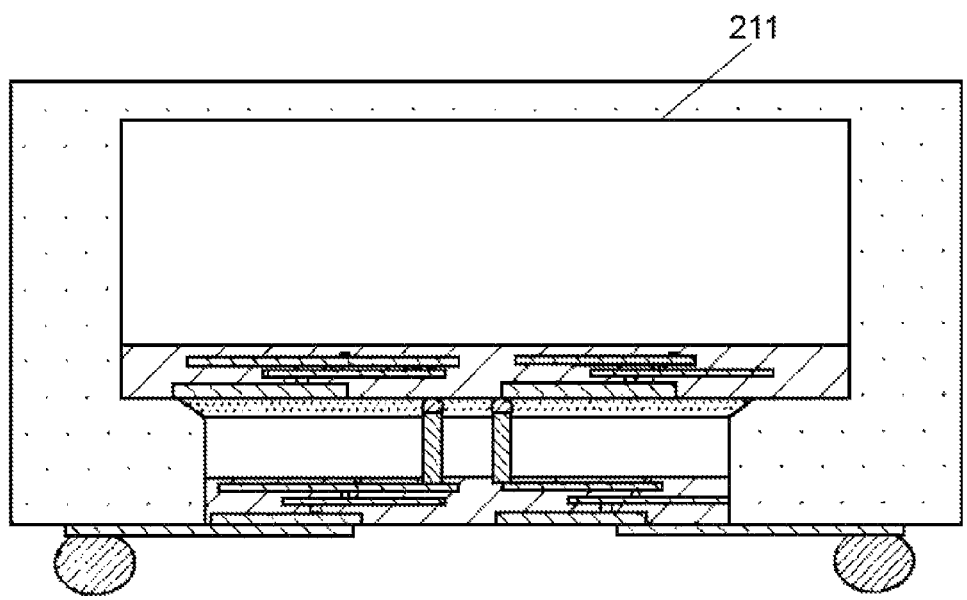
FIG. 19 is still another process sectional view showing the method for manufacturing the first semiconductor device in accordance with the first and second exemplary embodiment.

Next, as shown in FIG. 19, first restructured wafer 216 is divided into separate pieces each of which has one first laminated body 211.

The present exemplary embodiment has described a method of stacking separate first semiconductor chips 209 on second silicon substrate 206 in a chip-to-wafer manner. The present disclosure is not limited to this. The following method may be employed: second silicon substrate 206 is firstly previously divided into a plurality of second semiconductor chips 212; and then, each first semiconductor chip 209 and each second semiconductor chip 212 are stacked in a chip-to-chip manner. When they are stacked in the chip-to-chip manner, the size of second silicon substrate 206 does not restrict the manufacturing device and hence the manufacturing cost can be reduced. A manufacturing device corresponding to the substrate size is required in the chip-to-wafer manner, but the throughput of the lamination process is higher than that in the chip-to-chip manner.

Second Exemplary Embodiment

Method 2 for Manufacturing Semiconductor Device

FIG. 10 to FIG. 14, FIG. 20, and FIG. 21 are process sectional views showing a method for manufacturing a second semiconductor device in accordance with the second exemplary embodiment. FIG. 10 to FIG. 14 show the same manufacturing method as that in the first exemplary embodiment, and hence are not described here.

Figure 20:
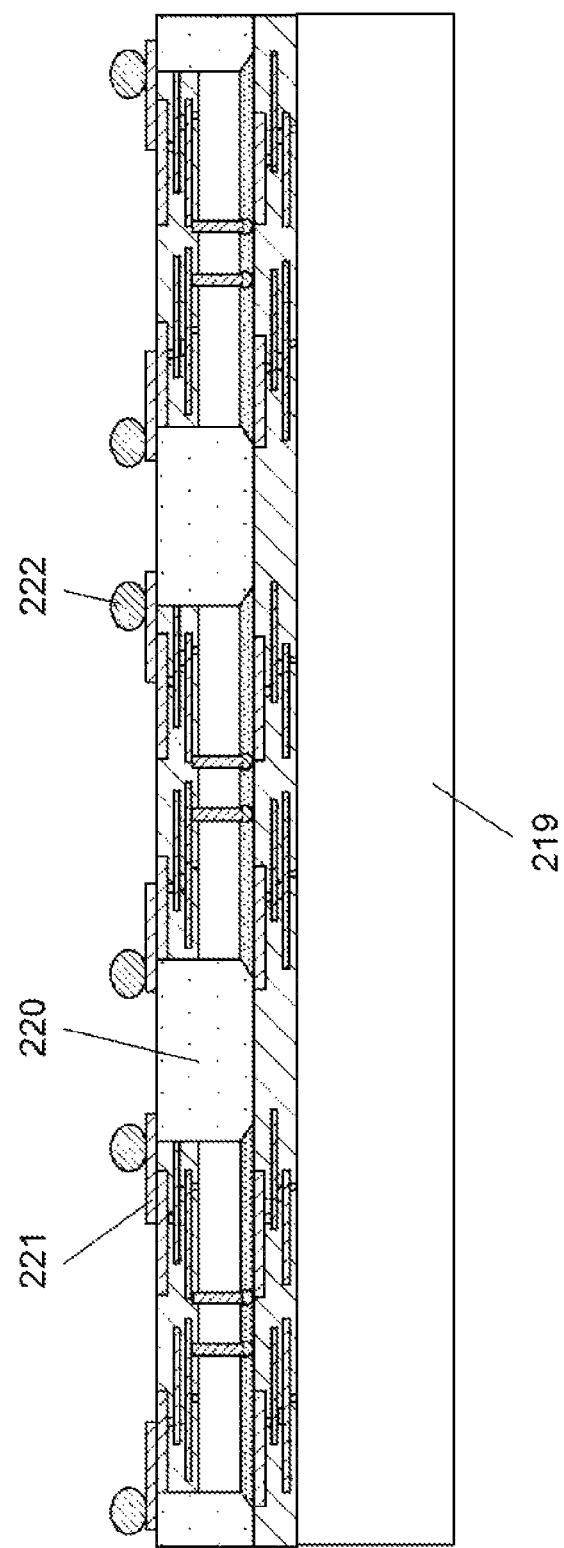
FIG. 20 is a process sectional view showing a method for manufacturing a second semiconductor device in accordance with a second exemplary embodiment.

Next, subsequently to the manufacturing process of FIG. 14 described in the first exemplary embodiment, the product of FIG. 14 (including second silicon substrate 206 pasted in the chip-to-wafer manner) is molded using resin into second restructured wafer 219 as shown in FIG. 20. Then, first resin 220 on the distribution layer side of first semiconductor chips 209 in second restructured wafer 219 is polished, thereby exposing the distribution layers of first semiconductor chips 209. On the distribution layer of each first semiconductor chip 209, second re-distribution layer 221 that is connected to the distribution layer is formed. Here, the distribution layer includes a resin expansion part formed around each first semiconductor chip 209. Third external electrodes 222 connected to second re-distribution layers 221 are formed. By stacking thinned first semiconductor chips 209 on thick second semiconductor chip 212, second semiconductor chip 212 serves as a support body of first semiconductor chips 209. Thus, an influence of the stress generated by packaging on first semiconductor chips 209 can be reduced.

Figure 21:
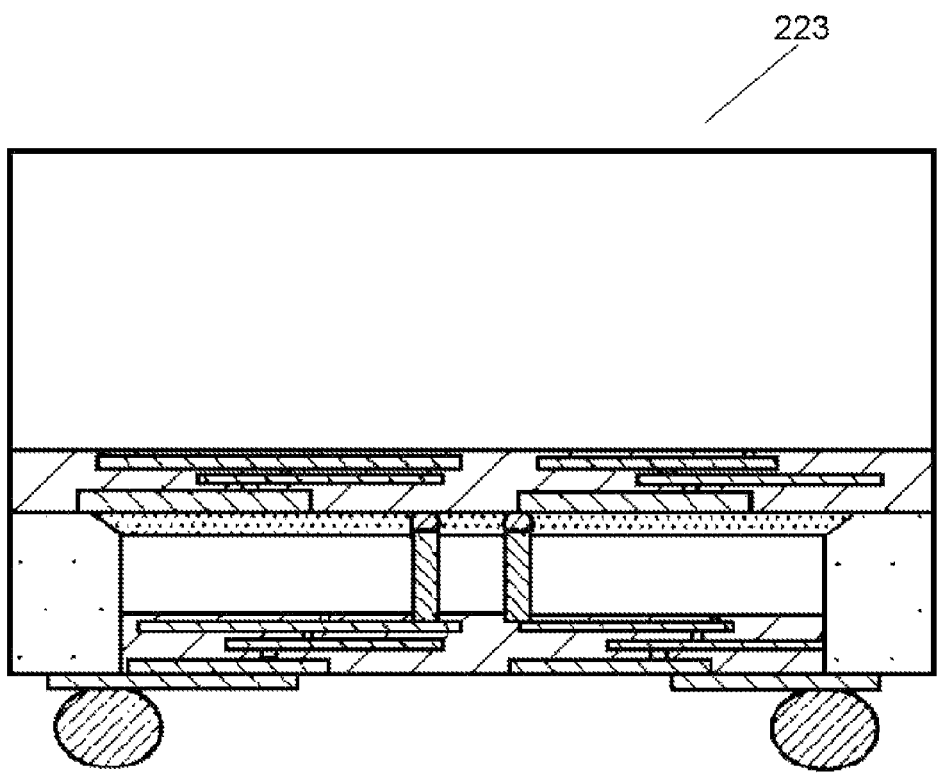
FIG. 21 is another process sectional view showing the method for manufacturing the second semiconductor device in accordance with the second exemplary embodiment.
Figure 22A:
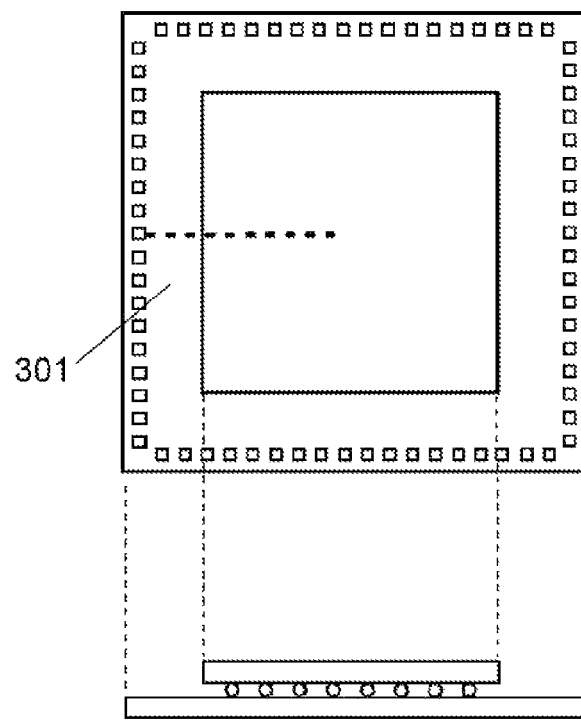
FIG. 22A is a sectional view and top view showing a semiconductor device of a conventional technology.
Figure 22B:
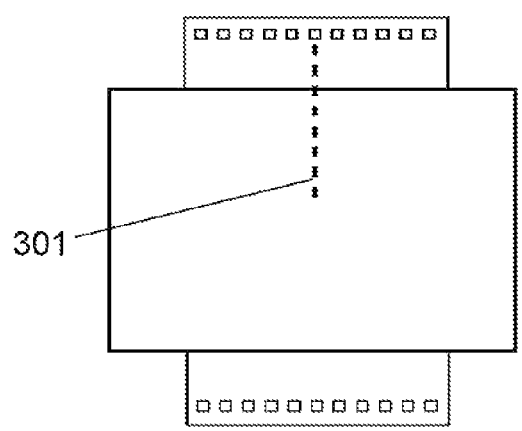
FIG. 22B is another top view showing the semiconductor device of the conventional technology.
Figure 22C:
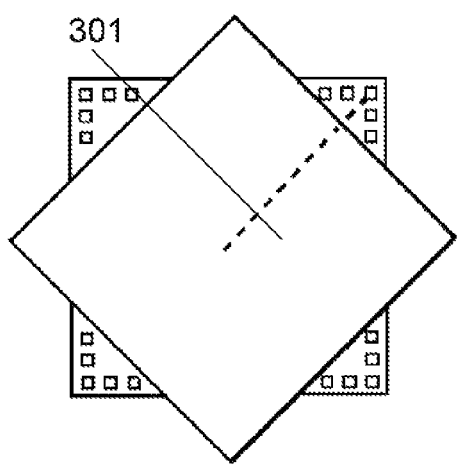
FIG. 22C is yet another top view showing the semiconductor device of the conventional technology.

Next, as shown in FIG. 21, second restructured wafer 219 is diced into second laminated bodies 223. Each third external electrode 222 is an external connection terminal of each second laminated body 223, and is connected to a signal line, a power supply line, or a ground line. A fan out region is formed of the main surface of first semiconductor chip 209 in second laminated body 223 and the front surface of first resin 220 that is disposed around first semiconductor chip 209 and includes second re-distribution layers 221.

By optimizing the layout of third external electrodes 222 as the external connection terminals of second laminated body 223 in the fan out region, the IR drop and transmission speed can be optimized.

In the present exemplary embodiment, the fan out region including a resin expansion region is restricted to be within the size of second semiconductor chip 212 formed on second silicon substrate 206. However, second silicon substrate 206 is used as a support substrate of resin when molding using the resin is performed, so that the manufacturing cost can be reduced.

As discussed above, in a semiconductor device and a method for manufacturing the semiconductor device of the present disclosure, the transmission speed of a signal between upper and lower chips can be increased by a silicon penetration electrode in a chip lamination package having a chip-on-chip structure. A resin expansion region is formed on the lower chip to form an external output terminal in a fan out structure. Thus, of the wirings led from both of the upper chip and lower chip to the outside, the wiring apt to be affected by wiring delay or IR drop can be set to be the shortest and a layout having a short wiring length is enabled. Thus, the semiconductor device and the manufacturing method are useful especially for an integrated circuit device or the like requiring high-speed signal processing.

What is claimed is:

1. A semiconductor device comprising:
    a first semiconductor chip including a main surface which has a distribution layer as an outermost layer and an element, a rear surface opposite the main surface, and penetration electrodes penetrating the main surface and the rear surface; and
    a second semiconductor chip including a main surface having an element and a rear surface opposite the main surface, wherein
    the first semiconductor chip and the second semiconductor chip are stacked via bonding sections so that the rear surface of the first semiconductor chip faces the main surface of the second semiconductor chip,
    each of the bonding sections includes a first electrode on the rear surface of the first semiconductor chip and a second electrode on the main surface of the second semiconductor chip,
    at least a part of a side surface of the first semiconductor chip is covered with a first resin,
    a re-distribution layer is produced on a plane formed by a surface of the distribution layer and a surface of the first resin,
    the surface of the distribution layer and the surface of the first resin are both parallel to the main surface of the first semiconductor chip,
    the re-distribution layer contacts a wiring being included in the distribution layer,
    an inter-layer insulating film is included in the distribution layer,
    a boundary line between the inter-layer insulating film and the first resin is formed on an extended line of a side surface of the first semiconductor chip, and formed on a plane formed by the surface of the distribution layer and the surface of the first resin, and
    at least a part of electrodes existing on the main surface of the second semiconductor chip is electrically connected to at least a part of first external electrodes via the penetration electrodes penetrating the first semiconductor chip, the first external electrodes being formed on the redistribution layer.

2. The semiconductor device of claim 1, wherein an area of the main surface of the first semiconductor chip is different from an area of the main surface of the second semiconductor chip.

3. The semiconductor device of claim 1, wherein an area of the main surface of the first semiconductor chip is smaller than an area of the main surface of the second semiconductor chip.

4. The semiconductor device of claim 1, wherein a thickness of the first semiconductor chip is different from a thickness of the second semiconductor chip.

5. The semiconductor device of claim 1, wherein the first semiconductor chip is thinner than the second semiconductor chip.

6. The semiconductor device of claim 1, wherein the first external electrodes are disposed on the re-distribution layer in both regions of the main surface of the first semiconductor chip and the surface of the first resin.

7. The semiconductor device of claim 1, wherein the first external electrodes are disposed on the re-distribution layer on only the surface of the first resin.

8. The semiconductor device of claim 1, wherein the bonding sections between the first semiconductor chip and the second semiconductor chip are disposed inside the first external electrode that is disposed in an innermost side, of the first external electrodes.

9. The semiconductor device of claim 1, wherein the penetration electrodes are disposed inside the first external electrode that is disposed in an innermost side, of the first external electrodes.

10. The semiconductor device of claim 1, wherein a bonding pitch between the bonding sections between the first semiconductor chip and the second semiconductor chip is equal to a pitch between the penetration electrodes.

11. The semiconductor device of claim 1, wherein the first resin is formed also so as to cover a part of the rear surface of the first semiconductor chip and a periphery of the second semiconductor chip.

12. The semiconductor device of claim 1, wherein the first resin is formed so as to cover a part of the rear surface of the first semiconductor chip and the main surface of the second semiconductor chip, and expose at least a part of the rear surface or a side surface of the second semiconductor chip.

13. The semiconductor device of claim 1, wherein two facing side surfaces of the first semiconductor chip are exposed from the first resin.

14. The semiconductor device of claim 1, further comprising a second resin covering a peripheral region of the bonding sections between the first semiconductor chip and the second semiconductor chip.

15. The semiconductor device of claim 1, wherein a re-distribution layer is formed on the rear surface of the first semiconductor chip.

16. The semiconductor device of claim 1, wherein a minimum pitch between the first external electrodes is 150 μm or more.

17. The semiconductor device of claim 1, further comprising a wiring board having an electric wiring interconnecting a front surface and a rear surface of the wiring board, the first external electrodes being connected to the electric wiring on a front surface side of the wiring board, external connection electrodes being disposed on a rear surface side of the wiring board, wherein a minimum pitch between the external connection electrodes is 300 μm or more.

18. The semiconductor device of claim 1, wherein a plurality of second semiconductor chips are stacked.

19. The semiconductor device of claim 18, wherein of the stacked second semiconductor chips, a rear surface side of the second semiconductor chip formed on an uppermost layer is exposed from the first resin.

20. The semiconductor device of claim 1, wherein
    the first semiconductor chip is a logic chip having a logic circuit in an element region, and the second semiconductor chip is a memory chip having a memory circuit in an element region.

21. The semiconductor device of claim 1, wherein the first electrode is directly in contact with the second electrode.

22. The semiconductor device of claim 1, wherein the first electrode is in contact with at least one of the penetration electrodes.

* * * * *